US006656785B2

United States Patent
Chiang et al.

(10) Patent No.: US 6,656,785 B2
(45) Date of Patent: Dec. 2, 2003

(54) MIM PROCESS FOR LOGIC-BASED EMBEDDED RAM

(75) Inventors: Min-Hsiung Chiang, Taipei (TW); Hsiao-Hui Tseng, Tainan (TW); Hsien-Yuan Chang, Taipei (TW)

(73) Assignee: Taiwan Semiconductor Manufacturing Co. Ltd, Hsin Chu (TW)

( * ) Notice: Subject to any disclaimer, the term of this patent is extended or adjusted under 35 U.S.C. 154(b) by 11 days.

(21) Appl. No.: 09/978,421

(22) Filed: Oct. 15, 2001

(65) Prior Publication Data

US 2003/0073286 A1 Apr. 17, 2003

(51) Int. Cl.[7] .................. H01L 21/8242; H01G 7/06
(52) U.S. Cl. ................. 438/240; 438/3; 438/253
(58) Field of Search .............. 438/3, 240, 253–256, 438/396–399, 381

(56) References Cited

U.S. PATENT DOCUMENTS 6,271,084 B1 * 8/2001 Tu et al. ................. 438/240
6,281,540 B1 * 8/2001 Aoki ..................... 257/306

* cited by examiner

Primary Examiner—Jey Tsai
(74) Attorney, Agent, or Firm—Tung & Associates (57) ABSTRACT

A method for forming a metal-interlayer-metal (MIM) device in an embedded memory device, including semiconductor devices thereof. An MIM device can be formed upon a semiconductor substrate utilizing no more than one additional photo mask layer prior to the implementation of a back-end-of-line (BEOL) semiconductor fabrication operation, such that the MIM device can be configured as a low temperature MIM device that is fully compatible with logical semiconductor devices, thereby reducing associated manufacturing costs. The MIM device may be configured as an MIM capacitor for logic-based embedded DRAM devices, resulting in a high capacitance performed via an effective area extension of DRAM cell capacitors. Additonally, a low-temperature MIM capacitor thereof may be readily integrated for both Cu (Copper) and AlCu (Aluminum Copper) BEOL fabrication processes.

18 Claims, 4 Drawing Sheets

MIM PROCESS FOR LOGIC-BASED EMBEDDED RAM

TECHNICAL FIELD

The present invention relates to a semiconductor devices and fabrication methods thereof. More specifically, the present invention relates to a semiconductor device having a capacitor and a contact plug in a DRAM (Dynamic Random Access Memory) or the like, and to a manufacturing method thereof. The present invention also relates to MIM capacitor fabrication methods and systems. The present invention also relates to logic-based embedded DRAM devices and manufacturing methods thereof.

BACKGROUND OF THE INVENTION

In the integrated circuit (IC) industry, manufacturers are currently imbedding dynamic random access memory (DRAM) arrays on the same substrate as CPU cores or other logic devices. This technology is being referred to as embedded DRAM (eDRAM). Embedded DRAM generally can provide micro controller (MCU) and other embedded controllers faster access to larger capacities of on-chip memory at a lower cost than that currently available using conventional embedded static random access memory (SRAM) and/or electrically erasable programmable read only memory (EEPROM).

A semiconductor memory, such as a DRAM or embedded DRAM, mainly consists of a transistor and a capacitor. Therefore, improvement in the efficiency of these two structures tends to be the direction in which technology is developing. DRAM is generally a volatile memory, and the way to store digital signals is decided by charge or discharge of the capacitor in the DRAM. When the power applied on the DRAM is turned off, the data stored in the memory cell completely disappears. A typical DRAM cell usually includes at least one field effect transistor (FET) and one capacitor. The capacitor is used to store the signals in the cell of DRAM. If more charges can be stored in the capacitor, the capacitor has less interference when the amplifier senses the data. In recent years, the memory cell of a DRAM has been miniaturized more and more from generation to generation. Even if the memory cell is minimized, a specific charge is essentially stored in the storage capacitor of the cell to store the information.

When the semiconductor enters the deep sub-micron process, the size of the device becomes smaller. For the conventional DRAM structure, this means that the space used by the capacitor becomes smaller. Since computer software is gradually becoming huge, even more memory capacity is required. In the case where it is necessary to have a smaller size with an increased capacity, the conventional method of fabricating the DRAM capacitor needs to change in order to fulfill the requirements of the trend.

There are two approaches at present for reducing the size of the capacitor while increasing its memory capacity. One way is to select a high-dielectric material, and the other is to increase the surface area of the capacitor.

There are two main types of capacitor that increase capacitor area. These are the deep trench-type and the stacked-type, where digging out a trench and filling the trench with a conductive layer, a capacitive dielectric layer and a conductive layer in sequence for the capacitor form the deep trench-type capacitor.

When a dielectric material with a relatively high dielectric constant is used in a stacked capacitor, the materials for manufacturing the upper and the bottom electrodes need to be gradually replaced in order to enhance the performance of the capacitor. A structure known as a metal-insulator-metal (MIM) structure possesses a low-interfacial reaction specificity to enhance the performance of the capacitor. Therefore, it has become an important topic of research for the semiconductor capacitor in the future.

Cell areas are reduced, as a semiconductor device needs ultra-high integrity. Thus, many studies for increasing the capacitance of a capacitor are being developed. There are various ways of increasing the capacitance such as forming a stacked or trench typed three-dimensional structure, whereby a surface area of a dielectric layer is increased.

In order to constitute a cell area in a DRAM fabrication, transistors and the like are formed on a semiconductor substrate, storage and plate electrodes of polycrystalline silicon and a dielectric layer are formed wherein the dielectric layer lies between the electrodes, and metal wires are formed to connect the devices one another.

The obtainable capacitance of the storage capacitor tends to decrease dependent upon the level of the miniaturization of the storage cell. On the other hand, the necessary capacitance of the capacitor is almost constant when the storing voltage to be applied across the capacitor is fixed. Therefore, it is necessary for the capacitor to compensate the capacitance decrease due to the miniaturization by, for example, increasing the surface area of the capacitor. This surface area increase has been popularly realized by increasing the thickness of the lower electrode (or, storage electrode) of the capacitor. A typical capacitor utilized in DRAM fabrication is the Metal Insulator Metal (MIM) capacitor, which is usually located in the memory region of DRAM and embedded DRAM to increase the capacitance of the capacitor.

To integrate logic and memory devices in a single chip configuration without degrading transistor performance, low-temperature MIM capacitors with $Ta_2O_5$ as a dielectric material are currently used in the semiconductor manufacturing arts. In conventional MIM capacitor manufacturing processes, the total number of additional lithography steps generally required to manufacture capacitors in the BEOL process is in the range of 2 to 3. In order to manufacture SoC memory devices, however, additional lithography steps may be required. Additional lithography steps, however, increase mask add-on costs. Thus, the present inventor has concluded that a need exists for a new process for manufacturing logic-based embedded DRAM, including MIM capacitors thereof, without increasing mask add-on costs as one or more back-end lithography steps are added.

BRIEF SUMMARY OF THE INVENTION

The following summary of the invention is provided to facilitate an understanding of some of the innovative features unique to the present invention, and is not intended to be a full description. A full appreciation of the various aspects of the invention can be gained by taking the entire specification, claims, drawings, and abstract as a whole.

It is therefore one aspect of the present invention to provide an improved semiconductor fabrication method and system.

It is another aspect of the present invention to provide a method and system for fabricating a MIM capacitor.

It is yet another aspect of the present invention to provide a method and system for fabricating an MIM (metal insulator metal) capacitor utilized in an embedded DRAM-based semiconductor device.

The above and other aspects of the present invention are achieved as is now described. A method for forming a metal-interlayer-metal (MIM) device in an embedded memory device, including semiconductor devices thereof. An MIM device can be formed upon a semiconductor substrate utilizing no more than one additional photo mask layer prior to the implementation of a back-end-of-line (BEOL) semiconductor fabrication operation, such that the MIM device can be configured as a low temperature MIM device that is fully compatible with logical semiconductor devices, thereby reducing associated manufacturing costs. The MIM device may be configured as an MIM capacitor for logic-based embedded DRAM devices, resulting in a high capacitance performed via an effective area extension of DRAM cell capacitors. Additionally, a low-temperature MIM capacitor thereof may be readily integrated for both Cu (Copper) and AlCu (Aluminum Copper) BEOL fabrication processes.

Accordingly, in a first and preferred embodiment of the present invention, a MIM capacitor may be formed according to the following general fabrication process:

1. FEOL process to form the transistors (both LOGIC and DRAM), followed by the formation of a first inter-dielectric layer (ILD1).
2. Formation of SiON & second inter-dielectric layer (ILD2).
3. HAR contact formation.
4. Deposit SiON, perform DRAM crown lithography operation, followed by an oxide etch and a stop on SiON.
5. W (Tungsten) plug etch back.
6. TiN deposition and PR (or BARC) coating
7. PR and TiN etch back to form recess.
8. Deposit $TA_2O_5$ (or BST), TiN, and W
9. W/TiN/$TA_2O_5$ (or BST) etching back (or CMP) with a stop on SiON, followed by a removal of SiON
10. BEOL process of CU or AlCu In a second and alternative preferred embodiment of the present invention, an MIM capacitor may be formed according to the following general fabrication process:

1. FEOL process to form transistors, followed by ILD, contact, and M1 formation.
2. IMD1 deposition and CMP, DRAM cell node photo and etch, followed by TiN formation.
3. PR (Photo Resist) coating
4. PR & TiN etching back to form recess in cell node followed by PR stripping operation.
5. $TA_2O_5$ (or BST) TiN, and W deposition.
6. W CMP (or etch back) with a stop on oxide.
7. VIA1 photo and etch and W-plug formation.
8. M2 (Metal-2) formation and subsequent standard BEOL process.

BRIEF DESCRIPTION OF THE DRAWINGS

The accompanying figures, in which like reference numerals refer to identical or functionally-similar elements throughout the separate views and which are incorporated in and form part of the specification, further illustrate the present invention and, together with the detailed description of the invention, serve to explain the principles of the present invention.

DETAILED DESCRIPTION OF THE INVENTION

The particular values and configurations discussed in these non-limiting examples can be varied and are cited merely to illustrate embodiments of the present invention and are not intended to limit the scope of the invention.

Figure 1:
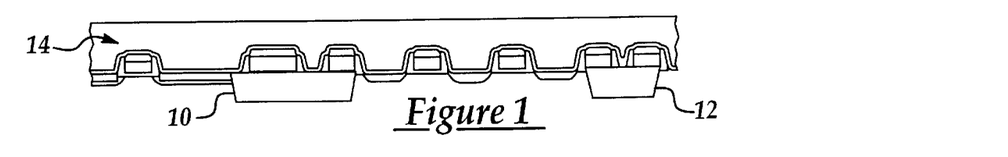
FIG. 1 depicts a first step of a semiconductor fabrication process, in accordance with a preferred embodiment of the present invention.

FIG. 1 illustrates a first step of a semiconductor fabrication process, in accordance with a preferred embodiment of the present invention. Capacitors or other semiconductor devices can be formed during a front-end-of-the-line (FEOL) process utilized to fabricate semiconductor devices. FIG. 1 thus indicates that a FEOL process may be utilized to form transistor, which may comprise both LOGIC and DRAM areas of a semiconductor devices. An interlayer dielectric 14 (ILD-1) may also be formed above a substrate, illustrated in FIG. 1 as substrates 10 and 14. Note that in FIG. 1 to 10 like parts are indicated by identical reference numerals. FIG. 1 thus depicts a FEOL process to form transistors. Such a process generally comprises implementing an RPO photo and etches, followed by a Co-salicide formation, and thereafter by a SiON (Silicon Oxynitride) deposition. The inter-dielctric layer 14 layer is formed following deposition of an SiON layer 12 (i.e. see FIG. 2). After deposition of inter-dielectric layer 14, a chemical mechanical processing (CMP) operation may be performed. It is important to note that the acronyms utilized herein with reference to FIGS. 1 to 18, such as, for example, RPO, HAR, ST1, ILD and FEOL are well known in the semiconductor arts.

In general, in fabricating microelectronic semiconductor devices and the like on a wafer substrate or chip, e.g., of silicon, to form an integrated circuit (IC), etc., various metal layers and insulation layers are deposited in selective sequence. To maximize integration of device components in the available substrate area to fit more components in the same area, increased IC miniaturization is utilized. Reduced pitch dimensions are needed for denser packing of components per present day very large scale integration (VLSI), e.g., at sub-micron (below 1 micron, i.e., 1,000 nanometer or 10,000 angstrom) dimensions.

One type of wet chemical process used in the IC fabrication of a semiconductor wafer involves the chemical mechanical polishing (CMP) of a surface of the wafer against a polishing pad during relative periodic movement there between, such as with a caustic slurry containing finely divided abrasive particles, e.g., colloidal silica in an aqueous potassium hydroxide (KOH) solution, as the polishing liquid. This removes, i.e., by chemical etching and mechanical abrasion, a thin layer of material, e.g., of 1 micron or less thickness, so as to planarize a top surface of the wafer. Close control of the slurry flow rate, temperature and pH are necessary to attain in a reproducible manner a uniform removal rate per the CMP operation.

Thus, one potential type of CMP process, for example, that may be utilized in accordance with an implementation of the present invention may involve the introduction of a slurry from a stationary overlying tube drop-wise onto a polishing pad of a rotating table (platen) which rotates about a stationary platen axis and against which the wafer, which is carried by a retaining ring, makes frictional contact while the wafer and ring rotate and oscillates relative to the platen. The wafer is positioned in a medial aperture of the ring such that the ring also makes frictional contact with the polishing pad. As the position of the wafer relative to the platen varies during wafer rotation and oscillation, the slurry dispensing tube is always spaced a minimum clearance distance from the wafer. Those skilled in the art can appreciate, however, that other types of CMP processes may be utilized in accordance with the methods and systems of the present invention.

Figure 2:
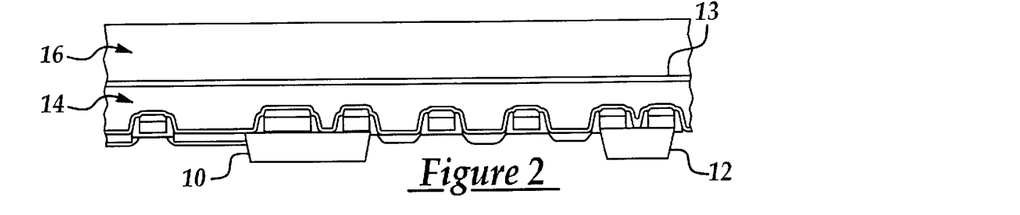
FIG. 2 illustrates a second step of a semiconductor fabrication process, in accordance with a preferred embodiment of the present invention.

FIG. 2 illustrates a second step of a semiconductor fabrication process, in accordance with a preferred embodiment of the present invention. The SiON layer is illustrated specifically in FIG. 2, along with M1 formation also takes place through processing of first step 10 of FIG. 1. As indicated in FIG. 2, a second interlayer dielectric layer 16 is formed above the SiON layer, which in turn was formed above inter-dielectric layer 14. FIG. 2 thus depicts a two-step operational process, which involves the formation of an SiON layer, followed by the formation of a second inter-dielectric layer 16.

Figure 3:
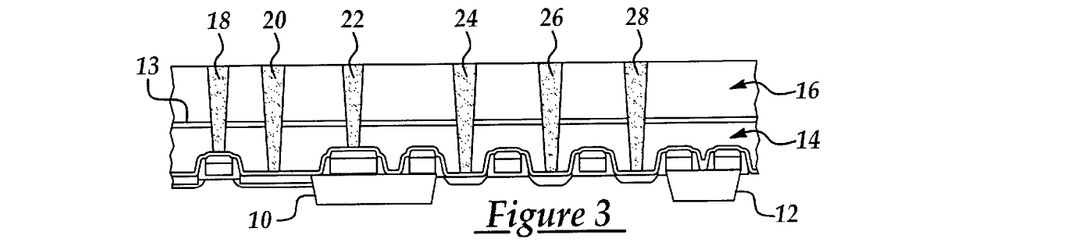
FIG. 3 depicts a third step of a semiconductor fabrication process, in accordance with a preferred embodiment of the present invention.

FIG. 3 depicts a third step of a semiconductor fabrication process, in accordance with a preferred embodiment of the present invention. HAR contact formation is illustrated in FIG. 3. Note that as utilized herein, the acronym HAR generally refers to "High Aspect Ratio." Thus, a HAR contact comprises a high aspect ration contact. FIG. 3 thus illustrates a two-step operational process in which contacts are formed through photo and etch operations, following by a W-plug formation step. Plugs 18 to 28 are depicted in FIG. 3 and are formed within inter-dielectric layers 14 and 16.

Figure 4:
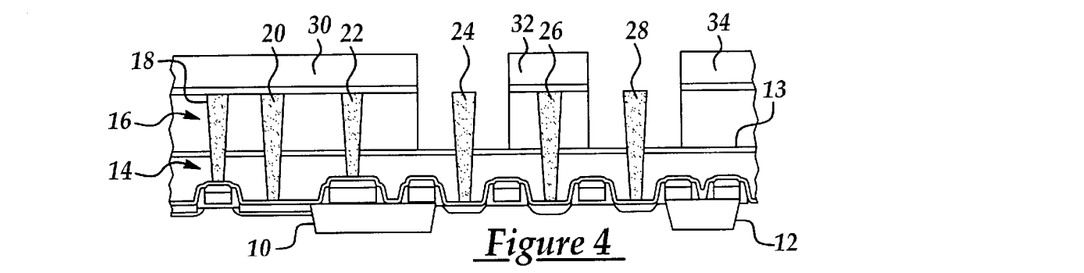
FIG. 4 illustrates a fourth step of a semiconductor fabrication process, in accordance with a preferred embodiment of the present invention.

FIG. 4 illustrates a fourth step of a semiconductor fabrication process, in accordance with a preferred embodiment of the present invention. FIG. 4 indicates a process in which SiON is deposited, followed by the implementation of a DRAM crown lithography step, followed by an oxide etch with a subsequent stop on SiON layer 35 formed thereof. Note that SiON layer 35 should be distinguished from SiON layer 13. As a result of the operation illustrated in FIG. 4, a photo resist layer, comprising photo resists 30, 32, and 34 is formed.

Figure 5:
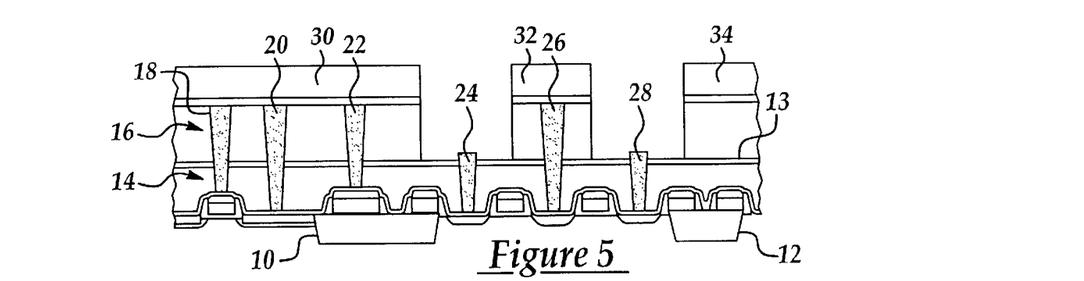
FIG. 5 depicts a fifth step of a semiconductor fabrication process, in accordance with a preferred embodiment of the present invention.

FIG. 5 depicts a fifth step of a semiconductor fabrication process, in accordance with a preferred embodiment of the present invention. As indicated in FIG. 5, a W-plug etch back step is performed. In the operation illustrated in FIG. 5, plugs 24 and 28 are reduced in size as a result of the W-plug etch back.

Figure 6:
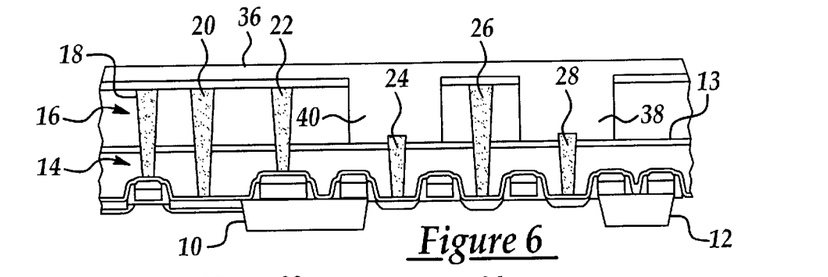
FIG. 6 illustrates a sixth step of a semiconductor fabrication process, in accordance with a preferred embodiment of the present invention.

FIG. 6 illustrates a sixth step of a semiconductor fabrication process, in accordance with a preferred embodiment of the present invention. As illustrated in FIG. 6, a TiN deposition layer is formed, along with a PR (or BARC in-line) coating thereof, indicated by the integrated layer 36, which was previously composed of separate photo resists 30, 32 and 34, as indicated previously in FIG. 5. TiN layers 38 and 40 are thus indicated in FIG. 6. Note that "TiN" refers titanium nitride.

Figure 7:
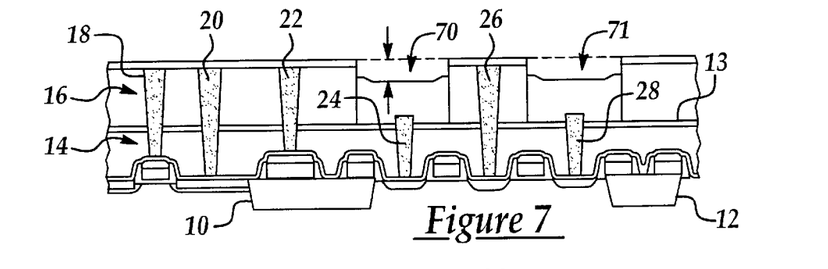
FIG. 7 depicts a sixth step of a semiconductor fabrication process, in accordance with a preferred embodiment of the present invention.

FIG. 7 depicts a sixth step of a semiconductor fabrication process, in accordance with a preferred embodiment of the present invention. The result of the PR and TiN etch back operation performed, as illustrated in FIG. 6, is depicted in FIG. 7. Specifically, a recess 70 and a recess 71 is formed as a result of the PR and TiN etch back.

Note that the term "BARC" is an acronym that may refer generally to a bottom ARC (BARC). Generally, an anti-reflective coating (ARC) layer can be deposited on a top of an insulative layer before etching. ARC layers are particularly important for deep UV or i-line lithography associated with scaled-down CMOS devices and flash memory devices. The ARC layer reduces line width variations due to steps on the IC structure. (The ARC layer serves to planarize the top surface of the substrate.) The ARC layer can be typically configured as a polymer film (organic, e.g., CD11), which is highly absorbing and non-bleaching at the exposure wavelengths associated with the photolithographic process. The ARC layer absorbs most of the radiation (70–85%) that penetrates the photo resist material and, thereby, substantially reduces standing wave effects and scattering from topographical features.

One exemplary type of ARC material is silicon oxide nitride (SiON). The SiON material can be utilized as a bottom ARC (BARC) layer in a deep ultra-violet (UV) contact lithographic process. After a photo resist material is selectively removed, the SiON material layer can be etched in accordance with the pattern of the photo resist material to define an aperture. The inter-level dielectric layer can be etched through the aperture until the top surface of the substrate is reached.

Figure 8:
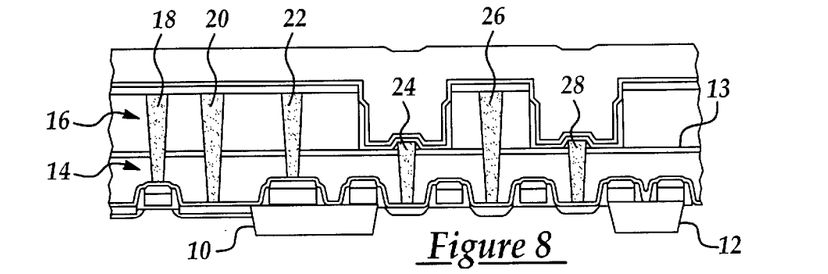
FIG. 8 illustrates an eighth step of a semiconductor fabrication process, in accordance with a preferred embodiment of the present invention.

FIG. 8 illustrates an eighth step of a semiconductor fabrication process, in accordance with a preferred embodiment of the present invention. FIG. 8 depicts an operation in which $TA_2O_5$ (or BST) is deposited, followed by a TiN layer and a W (i.e. Tungsten) layer, which may be formed from a metal layer, such as, for example copper. Thus, the W layer depicted in FIG. 8 may comprise copper. The $TA_2O_5$ (or BST) and TiN deposition layers are depicted in FIG. 8, along with SiON layer 35. The sequence of operations performed, as indicated in FIG. 8, is as follows: $TA_2O_5$(or BST)/TiN/ W-sputter.

Figure 9:
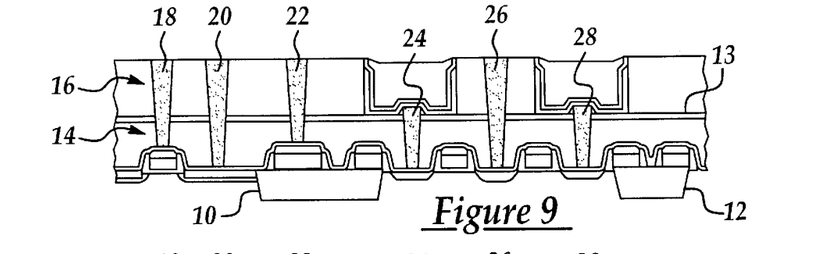
FIG. 9 depicts a ninth step of a semiconductor fabrication process, in accordance with a preferred embodiment of the present invention.

FIG. 9 depicts a ninth step of a semiconductor fabrication process, in accordance with a preferred embodiment of the present invention. The operational step illustrated in FIG. 9 comprises a W/TiN/$TA_2O_5$(or BST) etch back (or CMP) with a stop on SiON, followed by a removal of SiON. Note generally that as utilized herein, the term stop generally refers to a stop layer. The formation and selection of a stop layer has a restraining influence on the etching process utilized in the formation of semiconductor devices, such as embedded DRAM structures and MIM capacitor devices.

Figure 10:
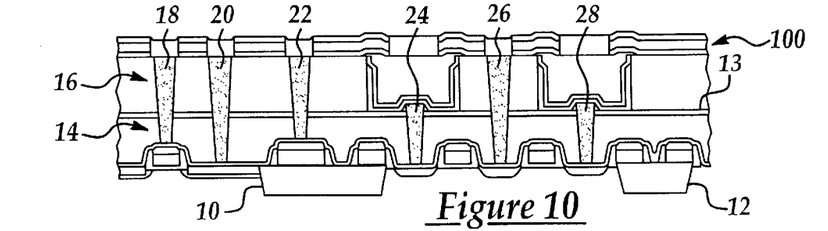
FIG. 10 illustrates a tenth step of a semiconductor fabrication process, in accordance with a preferred embodiment of the present invention.

FIG. 10 illustrates a tenth step of a semiconductor fabrication process, in accordance with a preferred embodiment of the present invention. Finally, as indicated in FIG. 10, a BEOL process of Cu or AlCu may be performed resulting in a metal-1 copper formation in the form of a Cu damascene 100. Note that as utilized herein, the term "BEOL" generally refers to a "back end of line" semiconductor chip manufacturing process. BEOL processes vary in industry, but are generally well known in the art.

The process illustrated in FIGS. 1 to 10 thus can be summarized as follows:
1. FEOL process to form the transistors (both LOGIC and DRAM), followed by the formation of a first inter-dielectric layer (ILD1).
2. Formation of SiON & second inter-dielectric layer (ILD2).
3. HAR contact formation.
4. Deposit SiON, perform DRAM crown lithography operation, followed by an oxide etch and a stop on SiON.
5. W-plug etch back.
6. TiN deposition and PR (or BARC) coating
7. PR and TiN etch back to form recess
8. Deposit $TA_2O_5$ (or BST), TiN, and W
9. W/TiN/$TA_2O_5$ (or BST) etching back (or CMP) with a stop on SiON, followed by a removal of SiON
10. BEOL process of CU or AlCu Note in general that a conventional semiconductor integrated circuit may be classified in response to a signal process mode as a digital type of integrated circuit (i.e., a logic circuit) in which an output signal is changed to an on/off type by a variation of input signal and an analog type of integrated circuit (i.e., analog circuit) in which an output signal linearly varies with a variation of input signal. Since the above-mentioned integrated circuits serve to memorize information in response to whether or not charge in capacitor is present without distinction between a digital type and an analog type, in order to maintain normal operation characteristic of the circuits, a capacitor must be fabricated lest its capacitance vary with the variation of temperature or voltage while its device is manufactured. The MIM capacitor that may be fabricated according to the methods and systems described herein thus comprises a low-temperature MIM capacitor.

The semiconductor processing operations illustrated in FIGS. 1 to 10 herein thus indicates that the number of additional lithographic steps for DRAM cell MIM capacitor formation comprises only one step. Additionally, an advantage that can be obtained through an implementation of the operational steps illustrated in FIGS. 1 to 10 is that a low temperature MIM capacitor can be readily and efficiently integrated for both Cu and standard AlCu BEOL processes. Another advantage of the processing steps depicted in FIGS. 1 to 10 lies in the fact that these steps are fully compatible with LOGIC processes (i.e. logic circuit manufacturing processes), except the HAR contact portion, which is not a major concern, thereby reducing associated mask add-on costs.

In alternative preferred embodiment of the present invention is illustrated in FIGS. 11 to 18 herein. FIGS. 11 to 18 together disclose an alternative semiconductor formation process, which results in the minimization of photo mask add-on costs while achieving a higher capacitance than, can be presently obtained. FIGS. 11 to 18 describe a novel process in which only one lithographic step is added for MIM capacitor formation, which is suitable for LOGIC-based embedded DRAM devices. Note that in FIGS. 11 to 18 herein, like parts are indicated by identical reference numerals. FIGS. 11 to 18 should just be interpreted together representing sequential steps and operations in of a semiconductor formation process, in accordance with an alternative preferred embodiment of the present invention.

Figure 11:
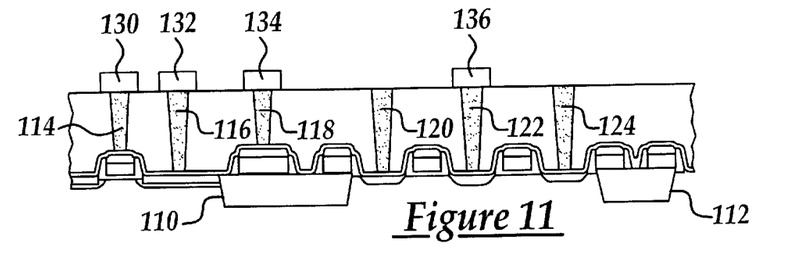
FIG. 11 depicts a first step of a semiconductor fabrication process, in accordance with an alternative preferred embodiment of the present invention.

FIG. 11 thus depicts a first step of a semiconductor fabrication process, in accordance with an alternative preferred embodiment of the present invention. As indicated in FIG. 11, a semiconductor device, such as an MIM capacitor used in embedded DRAM chips, may be formed on a semiconductor substrate, represented as substrates 110 and 112. Note that substrates 110 and 112 of FIG. 11 are analogous to substrates 10 and 12 of FIGS. 1 to 10. Additionally, plugs 114 to 124 of FIGS. 11 to 18 are respectively analogous to plugs 18 to 28 of FIGS. 1 to 10. FIG. 11 also indicates the formation of metal layers 130 to 136. Thus, as depicted in FIG. 11, a FEOL semiconductor fabrication process can be utilized to form transistors, followed by an ILD layer, a contact layer, and an Ml (metal one) layer. Metal layers 130 to 136 represent an M1 layer. Thus, a contact photo and etch operation can be performed, followed thereafter by the formation of one or more W-plugs. An M1 sputter operation can then be performed, followed by an Ml photo and etch operation.

Figure 12:
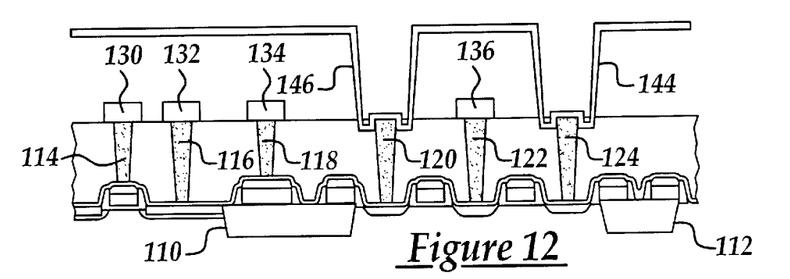
FIG. 12 illustrates a second step of a semiconductor fabrication process, in accordance with an alternative preferred embodiment of the present invention.

FIG. 12 illustrates a second step of a semiconductor fabrication process, in accordance with an alternative preferred embodiment of the present invention. As illustrated in FIG. 12, an IMD1 layer (i.e. inter metal-1 dielectric layer) is deposited followed by a CMP operation, which is then followed by a DRAM cell node photo and etch. Thereafter, a TiN formation is configured, which includes the formations thereof of two nodes 146 and 144. A TiN sputter operation may be implemented to form the TiN layer depicted in FIG. 12.

Figure 13:
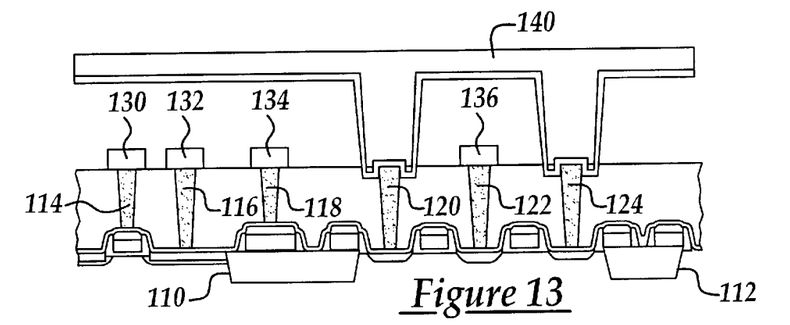
FIG. 13 depicts a third step of a semiconductor fabrication process, in accordance with an alternative preferred embodiment of the present invention.
Figure 14:
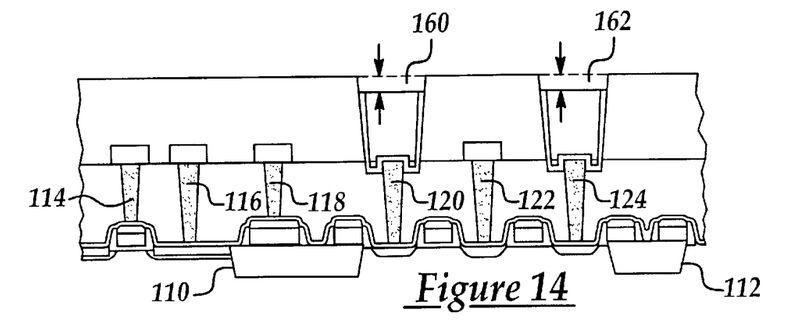
FIG. 14 depicts a fourth step of a semiconductor fabrication process, in accordance with an alternative preferred embodiment of the present invention.

FIG. 13 depicts a third step of a semiconductor fabrication process, in accordance with an alternative preferred embodiment of the present invention. As illustrated in FIG. 13, a photo resist 140 coating is formed above the TiN layer. FIG. 14 depicts a fourth step of a semiconductor fabrication process, in accordance with an alternative preferred embodiment of the present invention. As illustrated in FIG. 14, a photo resist etch back is performed followed by a TiN etch back, which results in the formation of recesses 160 and 162.

Figure 15:
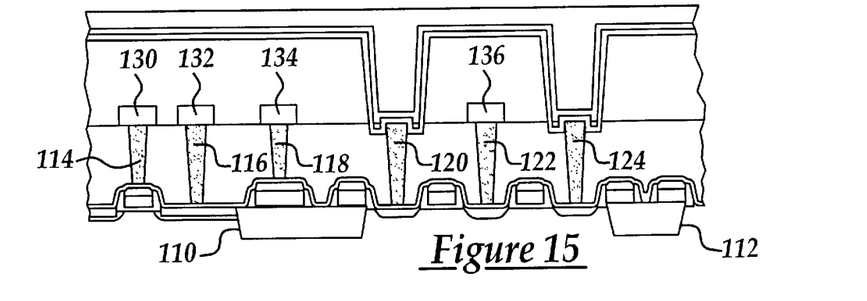
FIG. 15 depicts a fifth step of a semiconductor fabrication process, in accordance with an alternative preferred embodiment of the present invention.
Figure 16:
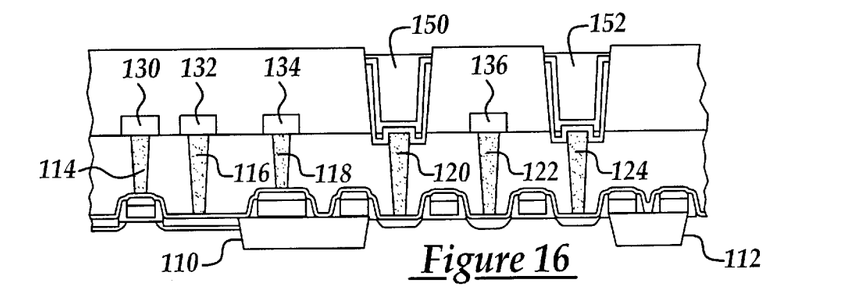
FIG. 16 illustrates a sixth step of a semiconductor fabrication process, in accordance with an alternative preferred embodiment of the present invention.

FIG. 15 depicts a fifth step of a semiconductor fabrication process, in accordance with an alternative preferred embodiment of the present invention. As illustrated in FIG. 15, a TA$_2$O$_5$ (or BST) deposition layer is formed, followed by a TiN layer, which in turn is followed by a W deposition layer utilizing a W sputter operation. FIG. 16 illustrates a sixth step of a semiconductor fabrication process, in accordance with an alternative preferred embodiment of the present invention. As shown in FIG. 16, a W CMP (or etch back) operation is performed followed by a stop on an oxide layer, resulting in the formation of structures 150 and 152

Figure 17:
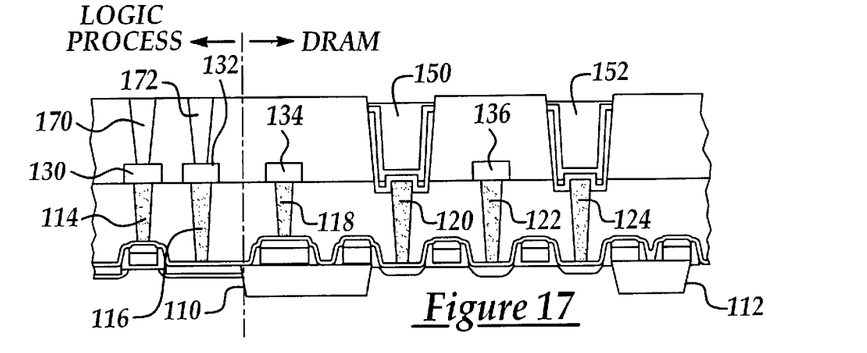
FIG. 17 depicts a seventh step of a semiconductor fabrication process, in accordance with an alternative preferred embodiment of the present invention.
Figure 18:
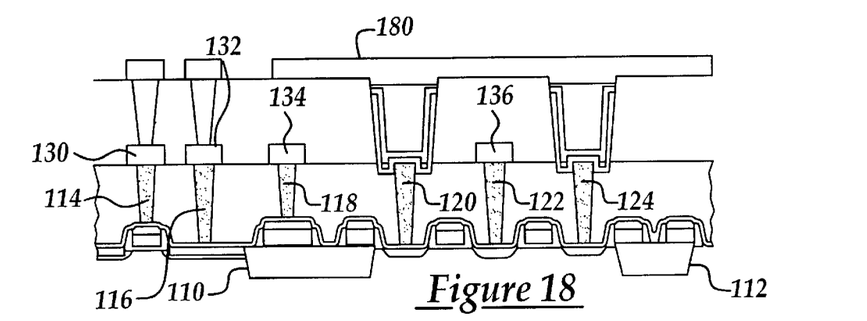
FIG. 18 illustrates an eighth step of a semiconductor fabrication process, in accordance with an alternative preferred embodiment of the present invention.

FIG. 17 depicts a seventh step of a semiconductor fabrication process, in accordance with an alternative preferred embodiment of the present invention. As indicated in FIG. 17, a VIA-1 photo and etch operation can be performed, followed by the formation of one or more W-plugs, which results in a division of logical process structures (i.e., LOGIC PROCESS) and memory structures (i.e. DRAM). Finally, FIG. 18 illustrates an eighth step of a semiconductor fabrication process, in accordance with an alternative preferred embodiment of the present invention. As depicted in FIG. 18, an M2 (i.e. metal-2) sputter operation can be performed followed by an M2 photo and etch operation, which results in the formation of an M2 cell plate (i.e. top plate) 180. Subsequent standard BEOL fabrication process can then be performed to finalize an MIM capacitor and embedded DRAM chip.

The fabrication process illustrated in FIGS. 11 to 18 can thus be summarized generally as follows:

1. FEOL process to form transistors, followed by ILD, contact, and M1 formation.
2. IMD1 deposition and CMP, DRAM cell node photo and etch, followed by TiN formation.
3. PR (Photo Resist) coating
4. PR & TiN etching back to form recess in cell node followed by PR stripping operation.
5. TA$_2$O$_5$ (or BST), TiN, and W deposition.
6. W CMP (or etch back) with a stop on oxide.
7. VIA1 photo and etch and W-plug formation.
8. M2 (Metal-2) formation and subsequent standard BEOL process.

Based on the foregoing, it can be appreciated that a number of advantages may be obtained from implementing the operational semiconductor processing steps illustrated in FIG. 1 to 10 herein. First, the number of additional lithographic steps in the BEOL process is only one. Second, low-temperature MIM capacitors can be easily integrated using the W-plugs of the M2 level. Third, higher capacitance can be performed via the effective area extension of the resulting DRAM cell capacitor. Fourth, and finally, the process illustrated in FIGS. 1 to 10 is fully compatible with LOGIC processes, greatly reducing the associated cost.

The embodiments and examples set forth herein are presented to best explain the present invention and its practical application and to thereby enable those skilled in the art to make and utilize the invention. Those skilled in the art, however, will recognize that the foregoing description and examples have been presented for the purpose of illustration and example only. Other variations and modifications of the present invention will be apparent to those of skill in the art, and it is the intent of the appended claims that such variations and modifications be covered. The description as set forth is thus not intended to be exhaustive or to limit the scope of the invention. Many modifications and variations are possible in light of the above teaching without departing from scope of the following claims. It is contemplated that the use of the present invention can involve components having different characteristics. It is intended that the scope of the present invention be defined by the claims appended hereto, giving full cognizance to equivalents in all respects.

What is claimed is:

1. A method for forming a metal-interlayer-metal (MIM) device in an embedded memory device, said method comprising the steps of:

providing a semiconductor substrate;

forming an MIM device upon said semiconductor substrate utilizing no more than one additional photo mask layer prior to an implementation of a back-end-of-line (BEOL) semiconductor fabrication operation; and configuring said MIM device to comprises a low temperature MIM device, wherein said low temperature MIM device is fully compatible with logical semiconductor devices, thereby reducing associated manufacturing costs.

2. The method of claim 1 further comprising the steps of:

forming at least one transistor during a front-end-of-line (FEOL) semiconductor fabrication operation upon said semiconductor substrate;

thereafter forming a first inter-dielectric layer; and subsequently forming an SiON layer followed thereafter by a second inter-dielectric layer.

3. The method of claim 2 further comprising the steps of:

forming at least one High Aspect Ration (HAR) contact; and thereafter depositing an SiON layer; performing a DRAM crown lithography operation;

and thereafter initiating an oxide etch with a subsequent stop on said SiON layer.

4. The method of claim 3 further comprising the steps of:

performing a Tungsten-plug etch back operation;

thereafter depositing TiN and a photo resist coating thereof;

performing next a photo resist and etch back operation;

thereafter depositing a TA$_2$O$_5$ (or BST), TiN and a Tungsten layer;

performing next a Tungsten/TiN/TA$_2$O$_5$ (or BST) etch back followed by a stop on an SiON layer, followed by the removal of said SiON layer; and thereafter implementing a BEOL process to finalize a fabrication of said MIM device in association with embedded memory device.

5. The method of claim 4 wherein the step of thereafter depositing TiN and a photo resist coating thereof, further comprises the step of thereafter depositing TiN and a BARC coating thereof, in lieu of said photo resist coating.

6. The method of claim 4 wherein the step of performing next a Tungsten/TiN/TA$_2$O$_5$ (or BST) etch back followed by a stop on an SiON layer, followed by the removal of said SiON layer, further comprises the step of performing next a chemical mechanical processing operation in lieu of said etch back.

7. The method of claim 1 further comprising the steps of:

forming at least one transistor during a front-end-of-line (FEOL) semiconductor fabrication operation upon said semiconductor substrate;

thereafter forming an interlayer dielectric layer, a contact formation, and a metal-1 formation;

thereafter depositing an first inter-metal dielectric layer;

performing a CMP operation thereof;

performing a DRAM cell node photo and etch operation; and thereafter forming a TiN layer.

8. The method of claim 7 further comprising the steps of:

depositing a photo resist coating;

performing a photo resist and TiN etch back operation to form at least one recess in a cell node thereof;

thereafter stripping said photo resist coating;

depositing subsequent $TA_2O_5$ (or BST), TiN and Tungsten deposition layers;

performing a CMP operation upon a Tungsten deposition layer; and stopping on an oxide layer thereof.

9. The method of claim 8 further comprising the steps of:

performing a VIA1 photo and etch operation;

thereafter forming at least one Tungsten-plug;

thereafter forming at least one metal-2 layer; and thereafter implementing a BEOL process to finalize a fabrication of said MIM device in association with embedded memory device.

10. The method of claim 8 wherein the step of performing a CMP operation upon a Tungsten deposition layer, further comprises the step of performing an etch back operation in lieu of said CMP operation.

11. The method of claim 1 wherein said metal-interlayer-metal (MIM) device comprises an MIM capacitor.

12. The method of claim 11 wherein said embedded memory device comprises an embedded DRAM device.

13. The method of claim 12 wherein said low temperature MIM device comprises a low temperature MIM capacitor.

14. A method for forming a metal-interlayer-metal (MIM) device in an embedded memory device, said method comprising the steps of:

providing a semiconductor substrate;

forming at least one transistor during a front-end-of-line (FEOL) semiconductor fabrication operation upon said semiconductor substrate;

thereafter forming a first inter-dielectric layer;

subsequently forming an SiON layer followed thereafter by a second inter-dielectric layer;

forming at least one High Aspect Ration (HAR) contact;

thereafter depositing an SiON layer; performing a DRAM crown lithography operation; and thereafter initiating an oxide etch with a subsequent stop on said SiON layer;

performing a Tungsten-plug etch back operation;

thereafter depositing TiN and a photo resist coating thereof;

performing next a photo resist and etch back operation;

thereafter depositing a $TA_2O_5$ (or BST), TiN and a Tungsten layer;

performing next a Tungsten/TiN/$TA_2O_5$ (or BST) etch back followed by a stop on an SiON layer, followed by the removal of said SiON layer; and thereafter implementing a BEOL process to finalize a fabrication of said MIM device in association with embedded memory device to thereby form an MIM device upon said semiconductor substrate utilizing no more than one additional photo mask layer prior to an implementation of a back-end-of-line (BEOL) semiconductor fabrication operation, wherein said MIM device comprises a low temperature MIM device that is fully compatible with logical semiconductor devices, thereby reducing associated manufacturing costs.

15. The method of claim 14 wherein the step of thereafter depositing TiN and a photo resist coating thereof, further comprises the step of thereafter depositing TiN and a BARC coating thereof, in lieu of said photo resist coating.

16. The method of claim 14 wherein the step of performing next a Tungsten/TiN/$TA_2O_5$ (or BST) etch back followed by a stop on an SiON layer, followed by the removal of said SiON layer, further comprises the step of performing next a chemical mechanical processing operation in lieu of said etch back.

17. A method for forming a metal-interlayer-metal (MIM) device in an embedded memory device, said method comprising the steps of:

providing a semiconductor substrate;

depositing a photo resist coating upon said semiconductor substrate;

performing a photo resist and TiN etch back operation to form at least one recess in a cell node thereof;

thereafter stripping said photo resist coating;

depositing subsequent $TA_2O_5$ (or BST), TiN and Tungsten deposition layers;

performing a CMP operation upon a Tungsten deposition layer;

stopping on an oxide layer thereof;

performing a VIA1 photo and etch operation;

thereafter forming at least one Tungsten-plug;

thereafter forming at least one metal-2 layer; and thereafter implementing a BEOL process to finalize a fabrication of said MIM device in association with embedded memory device to thereby form an MIM device upon said semiconductor substrate utilizing no more than one additional photo mask layer prior to an implementation of a back-end-of-line (BEOL) semiconductor fabrication operation, wherein said MIM device comprises a low temperature MIM device that is fully compatible with logical semiconductor devices, thereby reducing associated manufacturing costs.

18. The method of claim 17 wherein the step of performing a CMP operation upon a Tungsten deposition layer, further comprises the step of performing an etch back operation in lieu of said CMP operation.

* * * * *